United States Patent
Doris et al.

(10) Patent No.: US 7,279,746 B2
(45) Date of Patent: *Oct. 9, 2007

(54) HIGH PERFORMANCE CMOS DEVICE STRUCTURES AND METHOD OF MANUFACTURE

(75) Inventors: Bruce B. Doris, Brewster, NY (US); Dureseti Chidambarrao, Weston, CT (US); Suk Hoon Ku, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

This patent is subject to a terminal disclaimer.

(21) Appl. No.: 10/604,190

(22) Filed: Jun. 30, 2003

(65) Prior Publication Data

US 2004/0262784 A1 Dec. 30, 2004

Related U.S. Application Data

(60) Provisional application No. 10/277,907, filed on Oct. 21, 2002.

(51) Int. Cl.
*H01L 29/76* (2006.01)

(52) U.S. Cl. ............ 257/338; 257/327; 257/369; 257/900; 257/E27.108

(58) Field of Classification Search ........... 257/199, 257/369, 371, 344, 408, 900, 336, 368, 338
See application file for complete search history.

(56) References Cited

U.S. PATENT DOCUMENTS

| | | | |
|---|---|---|---|
| 3,602,841 A | 8/1971 | McGroddy | |
| 3,763,312 A | 10/1973 | Yoneyama | |
| 4,256,514 A | 3/1981 | Pogge | |
| 4,577,391 A | 3/1986 | Hsia et al. | |
| 4,648,937 A | 3/1987 | Ogura et al. | |
| 4,665,415 A | 5/1987 | Esaki et al. | |
| 4,729,006 A | 3/1988 | Dally et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |

(Continued)

FOREIGN PATENT DOCUMENTS

JP 6-21089 1/1994

(Continued)

OTHER PUBLICATIONS

Huang et al., Jun. 3, 2004, United States Patent Application Publication, pp. 1-2.*

(Continued)

*Primary Examiner*—Tu-Tu Ho
(74) *Attorney, Agent, or Firm*—Joseph P. Abate, Esq.

(57) ABSTRACT

A semiconductor device structure includes at least two field effect transistors formed on same substrate, the first field effect transistor includes a spacer having a first width, the second field effect transistor includes a compressive spacer having a second width, the first width being different than said second width. Preferably, the first width is narrower than the second width. A tensile stress dielectric film forms a barrier etch stop layer over the transistors.

18 Claims, 15 Drawing Sheets

U.S. PATENT DOCUMENTS

| | | | |
|---|---|---|---|
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,254,866 A * | 10/1993 | Ogoh | 257/369 |
| 5,291,052 A | 3/1994 | Kim et al. | |
| 5,296,401 A | 3/1994 | Mitsui et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,547,894 A | 8/1996 | Mandelman et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,763,312 A | 6/1998 | Jeng et al. | |
| 5,828,103 A | 10/1998 | Hsu | |
| 5,840,593 A | 11/1998 | Leedy | |
| 5,861,651 A | 1/1999 | Brasen et al. | |
| 5,880,040 A | 3/1999 | Sun et al. | |
| 5,899,722 A | 5/1999 | Huang | |
| 5,905,293 A | 5/1999 | Jeng et al. | |
| 5,940,736 A | 8/1999 | Brady et al. | |
| 5,989,978 A | 11/1999 | Peidous | |
| 5,994,743 A | 11/1999 | Masuoka | |
| 6,008,126 A | 12/1999 | Leedy | |
| 6,025,280 A | 2/2000 | Brady et al. | |
| 6,028,339 A * | 2/2000 | Frenette et al. | 257/364 |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,222,238 B1 * | 4/2001 | Chang et al. | 257/369 |
| 6,228,694 B1 | 5/2001 | Doyle et al. | |
| 6,245,621 B1 | 6/2001 | Hirohama | |
| 6,246,095 B1 | 6/2001 | Brady et al. | |
| 6,248,623 B1 | 6/2001 | Chien et al. | |
| 6,255,169 B1 | 7/2001 | Li et al. | |
| 6,261,964 B1 | 7/2001 | Wu et al. | |
| 6,274,444 B1 | 8/2001 | Wang | |
| 6,281,532 B1 | 8/2001 | Doyle et al. | |
| 6,284,626 B1 | 9/2001 | Kim | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,975 B1 | 6/2002 | Brunner et al. | |
| 6,406,973 B1 | 6/2002 | Lee | |
| 6,476,462 B2 | 11/2002 | Shimizu et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,512,273 B1 * | 1/2003 | Krivokapic et al. | 257/369 |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,548,877 B2 * | 4/2003 | Yang et al. | 257/382 |
| 6,573,172 B1 | 6/2003 | En et al. | |
| 6,621,131 B2 | 9/2003 | Murthy et al. | |
| 6,806,584 B2 * | 10/2004 | Fung et al. | 257/368 |
| 6,825,529 B2 * | 11/2004 | Chidambarrao et al. | 257/336 |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0090791 A1 | 7/2002 | Doyle et al. | |
| 2003/0040158 A1 | 2/2003 | Saitoh | |
| 2003/0181005 A1 * | 9/2003 | Hachimine et al. | 438/231 |
| 2004/0106249 A1 * | 6/2004 | Huotari | 438/216 |

FOREIGN PATENT DOCUMENTS

| | | |
|---|---|---|
| JP | 09-283760 | 10/1997 |
| JP | 9-283760 | 10/1997 |

OTHER PUBLICATIONS

Novel Locally Strained Channel Technique for High Performance 55nm CMOS K. Ota, et al. 2002 IEEE, 2.2.1-2.2.4, IEDM 27. Local Mechanical-Stress Control (LMC): A New Technique for CMOS—Performance Enhancement A. Shinizu, et al. 2001 IEEE, 19.4.1-19.4.4, IEDM 01-433.

Mechanical Stress Effect of Etch-Stop Nitride and its Impact on Deep Submicron Transistor Design Shinya Ito, et al. 2000 IEEE, 10.7.1-10,7.4, IEDM 00-247. A Highly Dense, HIgh-Performance 130nm node CMOS Technology for Large Scale System -on-a-Chip Applications F. Ootsuka, et al. 2000 IEEE, 23.5.1-23.5.4, IEDM 00-575.

NMOS Drive Current Reduction Caused by Transistor-Layout and Trench Isolation Induced Stress Gregory Scott, et al. 1999 IEEE, 34.4.1-34.4.4, IEDM 99-827. Transconductance Enhancement in Deep Submicron Strained-Si n- MOSFETs Kern (Ken) Rim, et al. 1998 IEEE, 26.8.1-26.8.4, IEDM 98-707.

Characteristics and Device Design of Sub-100 nm Strained Si N- and PMOSFET's K. Rim, et al. 2002 IEEE, 98-99, 2002 Symposium On VLSI Technology Digest of Technical Papers.

* cited by examiner

HIGH PERFORMANCE CMOS DEVICE STRUCTURES AND METHOD OF MANUFACTURE

CROSS REFERENCE TO RELATED APPLICATIONS

This application is related to commonly-owned, co-pending application Ser. No. 10/277,907, filed Oct. 21, 2002, "Semiconductor Device Structure Including Multiple FETs Having Different Spacer Widths", Fung et al., which is hereby incorporated in its entirety by reference.

BACKGROUND OF INVENTION

The present invention relates to semiconductor device structures and, more particularly, to FET device structures formed on the same substrate, and to methods for their manufacture.

In CMOS technologies, nFET and pFET devices are optimized to achieve required CMOS performance. The dopant species used for nFET and pFET devices have different physical properties, accordingly. For example, diffusivity and maximum active concentration vary significantly for different dopant species. In conventional CMOS technologies, nFET and pFET share the same spacer process for the source/drain implant. The common spacer process forces the source-drain implant to have the same off-set distance from the edge of the gate electrode for both nFET and pFET. In order to optimize CMOS performance, the spacers typically are of one width and are designed to trade-off the performance between nFET and pFET. For example, if Arsenic and Boron are used as the source/drain dopants for nFET and pFET, respectively, it is known that a narrower spacer is better for nFET, because the shorter distance between source and drain results in an increased drive current, but a much wider spacer is needed for the pFET, because the increased diffusivity of Boron compared to Arsenic results in a degraded short channel effect control for the pFET. In this case, the pFET is a limiting factor because good short channel effect control is a strict requirement for a CMOS technology. Thus, the maximum width of all spacers is optimized for pFET, trading-off the nFET performance. See, for example, U.S. Pat. No. 5,547,894 (Mandelman et al., issued Aug. 20, 1996, entitled "CMOS Processing with Low and High-Current FETs"); U.S. Pat. No. 4,729,006 (Dally et al., issued Mar. 1, 1998, entitled "Sidewall Spacers for CMOS Circuit Stress Relief/Isolation and Method for Making"); and U.S. Pat. No. 4,648,937 (Ogura et al., issued Mar. 10, 1987, entitled "Method of Preventing Asymmetric Etching of Lines in Sub-Micrometer Range Sidewall Images Transfer"); which are all incorporated by reference herein in their entireties.

It is a problem, therefore, to optimize spacer width and FET performance for both the nFET and the pFET on the same substrate.

One known method of improving drive current without degrading the short channel effect control is to improve charge carrier mobility. It is known that for devices oriented so that the current flows along the 110 direction, which is the industry standard, stress applied along the direct of current flow can influence charge carrier mobility. Specifically, compressive stress applied along the direction of current flow (longitudinal direction) increases hole mobility while tensile stress applied in the longitudinal direction increases electron mobility. Although longitudinal compressive stress increases hole mobility, the same longitudinal compressive stress degrades electron mobility. A similar phenomenon is true for longitudinal tensile stress. Tensile stress applied in the longitudinal direction degrades hole mobility.

It is also known that hole mobility is not degraded when tensile stress is applied along the longitudinal direction if the device is oriented so that the current flows along the 100 direction. See, for example, U.S. patent application No. 2002/0063292 A1, entitled "CMOS Fabrication Process Utilizing Special Transistor Orientation" by Armstrong et al., filed Nov. 29, 2000, published May 30, 2002, which is hereby incorporated in its entirety by reference. However, this prior art method requires major design modifications to orient the devices along different directions. In addition, this method apparently is only directed at improving mobility for nFETs and has no provisions for improving mobility for pFETs. Because performance is improved for only one device and overall circuit performance depends on the performance of both devices, the overall benefit will be limited. While it has been possible to improve mobility for one device, it has been difficult to improve mobility for both devices at the same time.

Therefore, a method of improving electron and hole mobility on the same substrate would be beneficial. It would be even more beneficial if the method of improving electron and hole mobility simultaneously provided a means for reducing (preferably, eliminating) the trade-off problem between short channel effect control for the pFET and drive current increase for the nFET.

The present invention solves these problems by using a dual-spacer width in combination with film stress optimization for the spacer and etch stop films. This combination permits optimizing nFET and pFET device performance independently while simultaneously improving charge carrier mobility for both electrons and holes on the same substrate.

It is a principal object of the present invention to optimize performances of two different MOS devices having a common semiconductor substrate.

It is an additional object of the present invention to optimize independently the performances of an nFET device and a pFET device formed on one substrate.

It is a further object of the present invention to increase the drive current performance of an nFET device while decreasing short channel effects in a pFET.

It is yet another object of this invention to increase charge carrier mobility for electrons and holes on the same substrate.

SUMMARY OF INVENTION

According to the present invention, a semiconductor device structure includes at least two field effect transistors and a barrier etch stop layer. More specifically, the semiconductor device structure includes a pFET device with a spacer, formed with a compressive film, which spacer is wider than the spacer for an nFET device. In addition, the semiconductor device structure contains a barrier etch stop layer that is formed from a tensile film.

The present invention also includes a method (process) for fabricating the semiconductor device structure.

BRIEF DESCRIPTION OF DRAWINGS

These and other objects, advantages and aspects of the invention will be better understood by the following detailed description of a preferred embodiment when taken in conjunction with the accompanying drawings.

DETAILED DESCRIPTION

Figure 14:
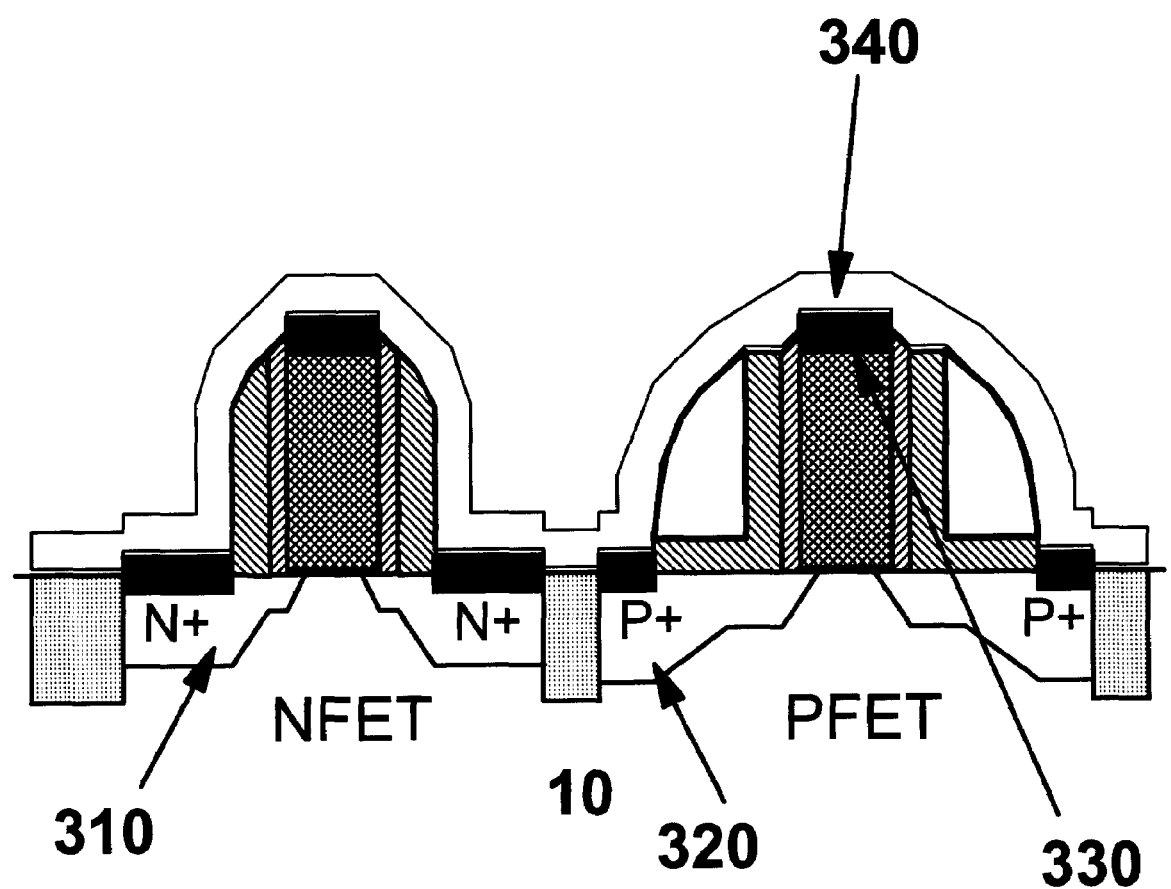
FIG. 14 shows the structure of FIG. 13, after source/drain implants 310,320, silicide formation 330, and formation of a tensile dielectric film comprising a barrier etch stop layer 340.
Figure 15:
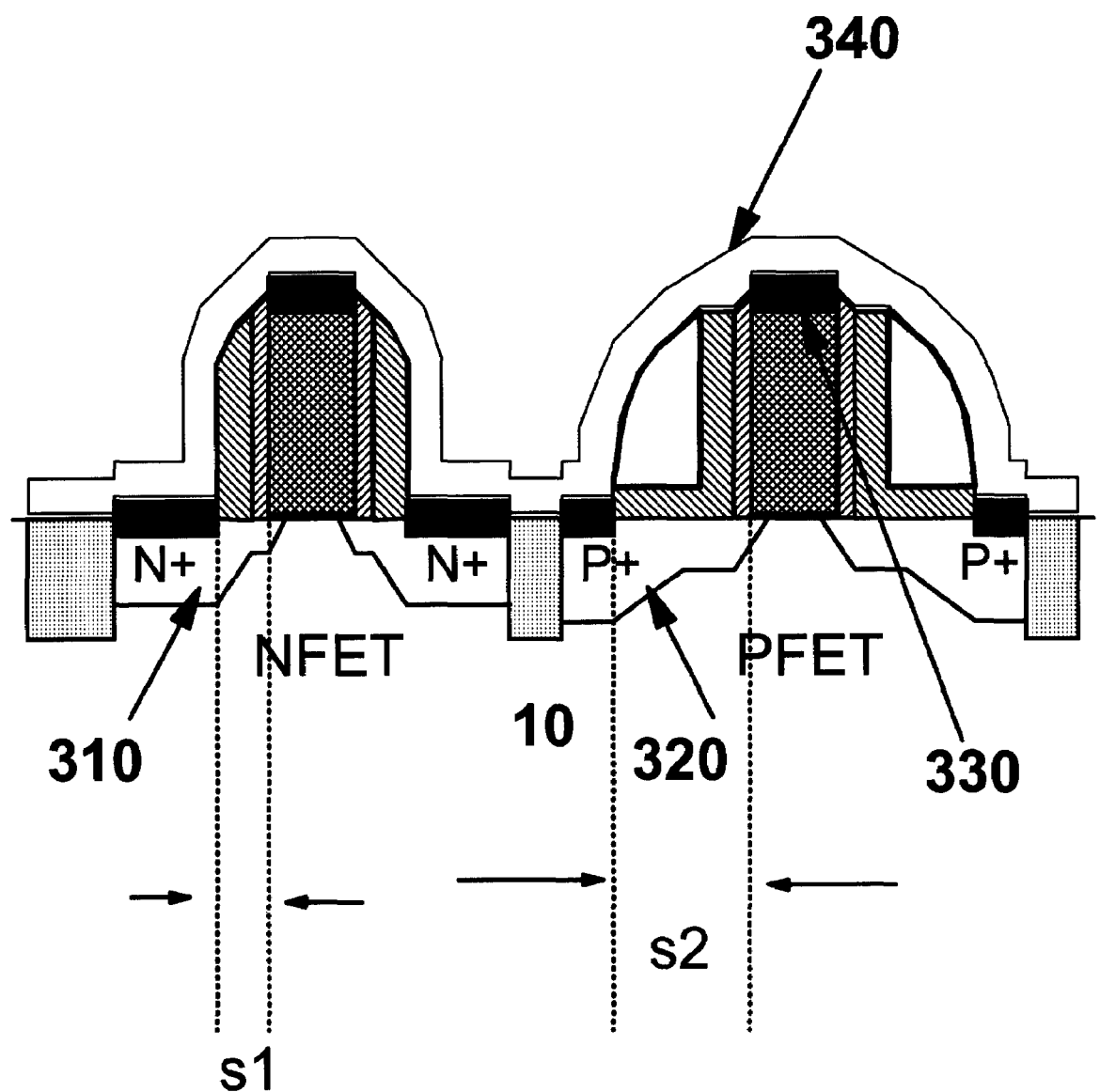
FIG. 15 is a cross-sectional schematic view of the inventive structure shown in FIG. 14, but further clarifying preferred features S1, S2 and layer 340 of the invention.

The present invention is described with the final structures (FIGS. 1, 2, 14, 15) first, and then with the preferred process sequence. Silicide formations 330 are not shown in FIGS. 1, 2 for convenience only, but would preferably by present as shown in FIGS. 14, 15.

Figure 1:
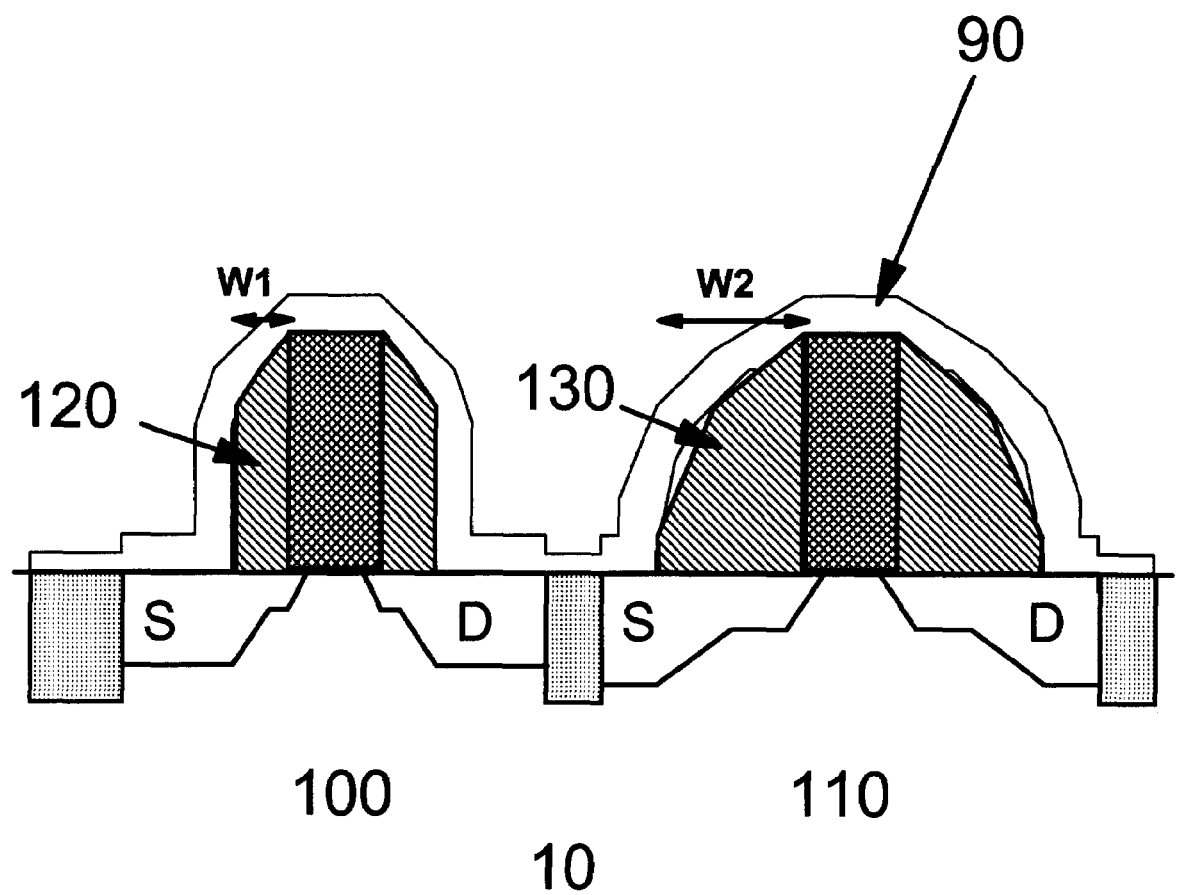
FIG. 1 is a side schematic view of two MOSFETs having different spacer widths, with at least the wider spacer formed from a compressive film, adjacent to each other on the same substrate, and a tensile spacer etch stop layer 90, all according to the present invention.

FIG. 1 shows a semiconductor device structure including two MOSFETs 100, 110 formed on the same semiconductor substrate 10 having two different spacers 120, 130, and a tensile stress layer 90 disposed on the at least two MOSFETs 100, 110. Spacer 120 has a smaller width (W1) than the width (W2) of spacer 130. MOSFETs having different spacer widths are taught, for example, in commonly-owned, co-pending patent application Ser. No. 10/277,907, previously incorporated herein by reference. According to an essential aspect of this structure, at least each spacer 130 is formed from a compressive dielectric film such as a PECVD silicon nitride. The substrate 10 is a bulk wafer, SOI wafer, GaAs or any type of suitable semiconductor substrate. The number of different spacer widths can be more than two, if necessary to meet the needs of different transistors.

Figure 2:
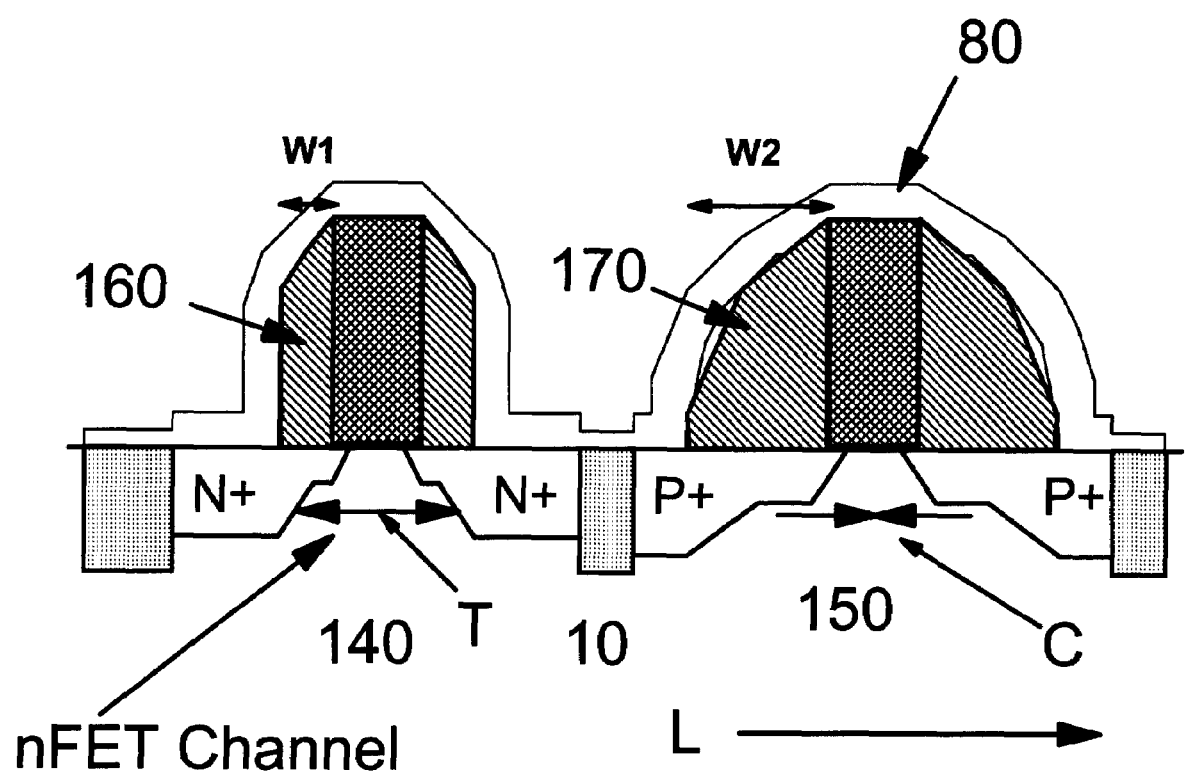
FIG. 2 is a side schematic view of n-type MOSFET having a narrower spacer and p-type MOSFET having a wider spacer (formed from a compressive film) adjacent to each other on the same substrate, and a tensile etch stop layer 80, all according to the present invention.

According to a preferred aspect of this invention, there are different spacer widths W1, W2 for an nFET 140 and a pFET 150 as shown in FIG. 2. The pFET 150 has each spacer 170, formed from a compressive dielectric film, which is wider than each spacer 160 for nFET 140, which spacer 160 may be formed from the same compressive film as the spacer 170 for the pFET. The spacers 120, 130, 160, 170 are schematically shown as single spacers for discussion, but are understood alternatively to include multiple layers or parts (composite spacers).

The wide compressive spacers 170 induce a compressive stress C in the channel for the pFET, along the same longitudinal direction L as an operational current flow. The longitudinal stress increases the carrier mobility for holes which significantly improves the drive current for the pFET 150 without degrading the short channel effect control. Because spacer width W2 for the pFET is independently controlled compared to the spacer width W1 for the nFET 140, separate performance optimization for both devices is attainable. The narrower spacer 160 allows the optimization of the source/drain implant N+ in nFET 140 in order to minimize known series resistance. In the preferred embodiment, the same compressive stress material (such as a SiN film) is used to form the spacers 160, 170. In this case, the narrow spacer 160 is not capable of inducing appreciable amounts of compressive stress to the nFET 140 due to its small size. Preferably, a maximum width for W1 is in a range of about (±10%) 10 nm to about 30 nm. Thus, the narrow compressive spacer 160 does not degrade the drive current for the nFET 140. A tensile barrier etch stop layer 80, such as CVD or PECVD SiN, is applied to the entire wafer. The barrier etch stop layer 80 is tensile, and each pFET spacer 170 is wide and has a film thickness of about 20 nm to about 50 nm. This condition prevents the tension from materially adversely influencing the charge carrier mobility in the pFET 150. Because the spacers for the nFET 160 are narrow, the longitudinal tension T imposed by the barrier etch stop layer 80 has a significant influence on the charge carrier mobility for the nFET 140. The combination of the narrow spacer 160 for the nFET and the tensile barrier etch stop layer 80 for the entire device structure results in performance improvement for nFET 140 above any improvement caused by the narrow spacer 160 alone. In addition, the pFET 150 experiences a performance improvement due to the wide compressive spacer 170 enhancing hole mobility in the pFET channel.

Figure 3:
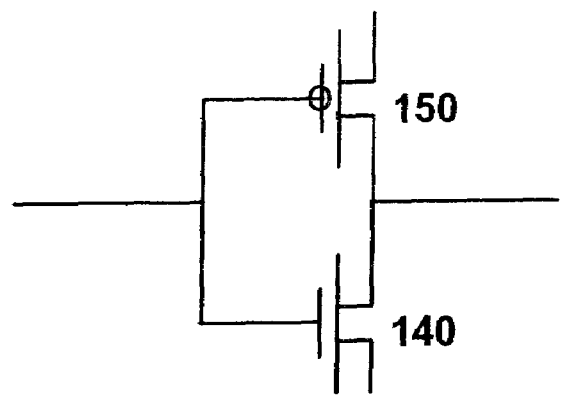
FIG. 3(a) is an inverter circuit schematic.
FIG. 3(b) is a top plan view of an on-wafer (on-substrate) layout of the inverter circuit having the dual width spacers with at least the larger spacer formed from a compressive film according to the present invention.
Figure 3:
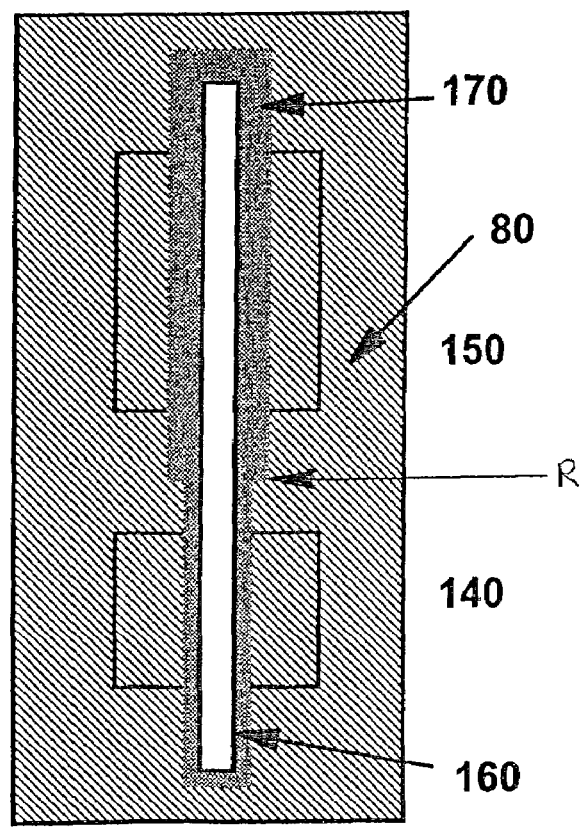
Figure 4:
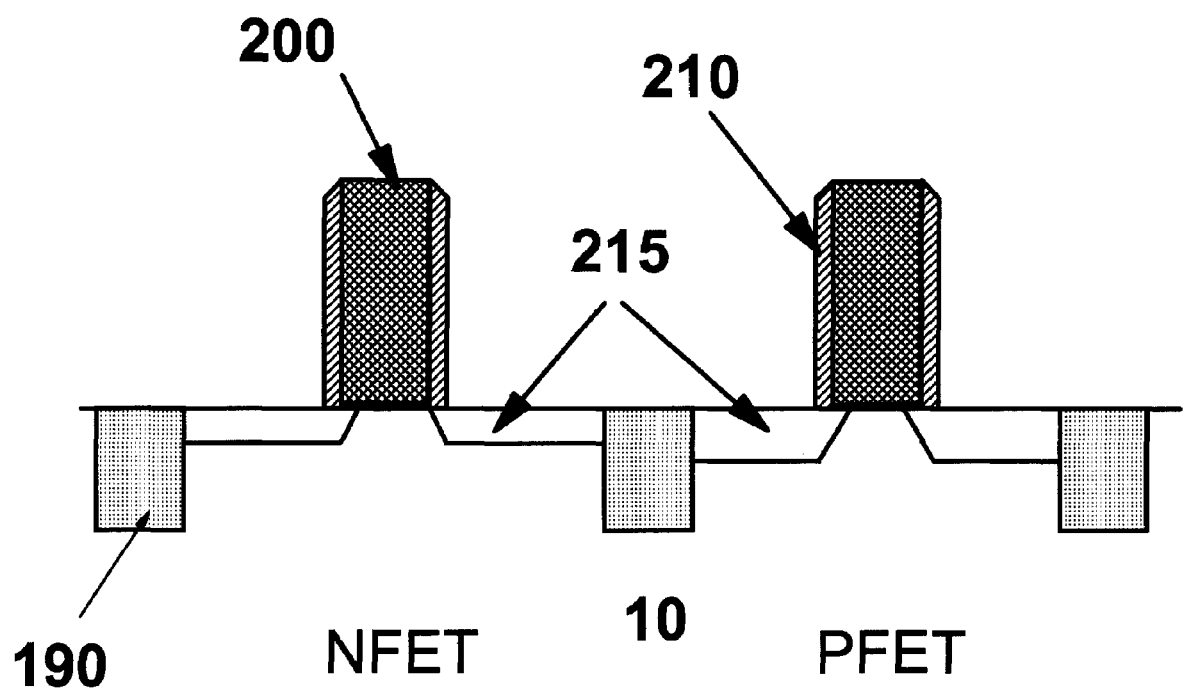
FIG. 4 is a side schematic view of a partially processed MOSFET device structure with gate stacks 200, optional extension spacers 210, extension implants 215 and isolations 190.
Figure 5:
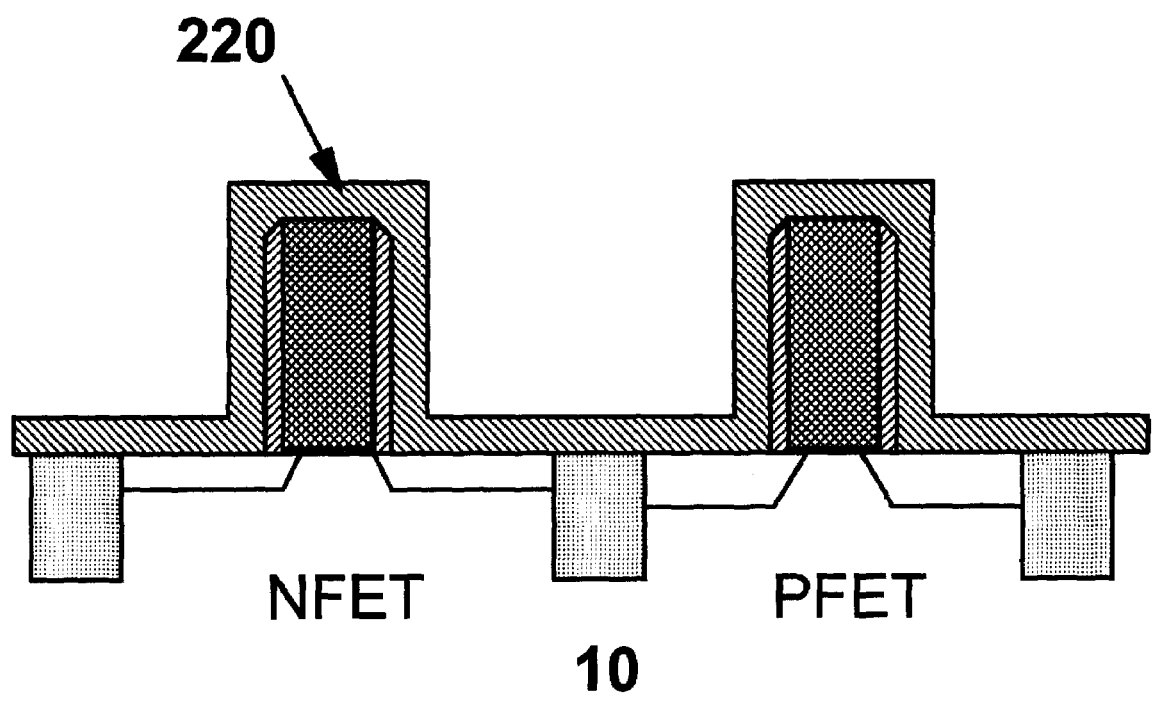
FIG. 5 shows the structure of FIG. 4, after a compressive dielectric film 220 is deposited.
Figure 6:
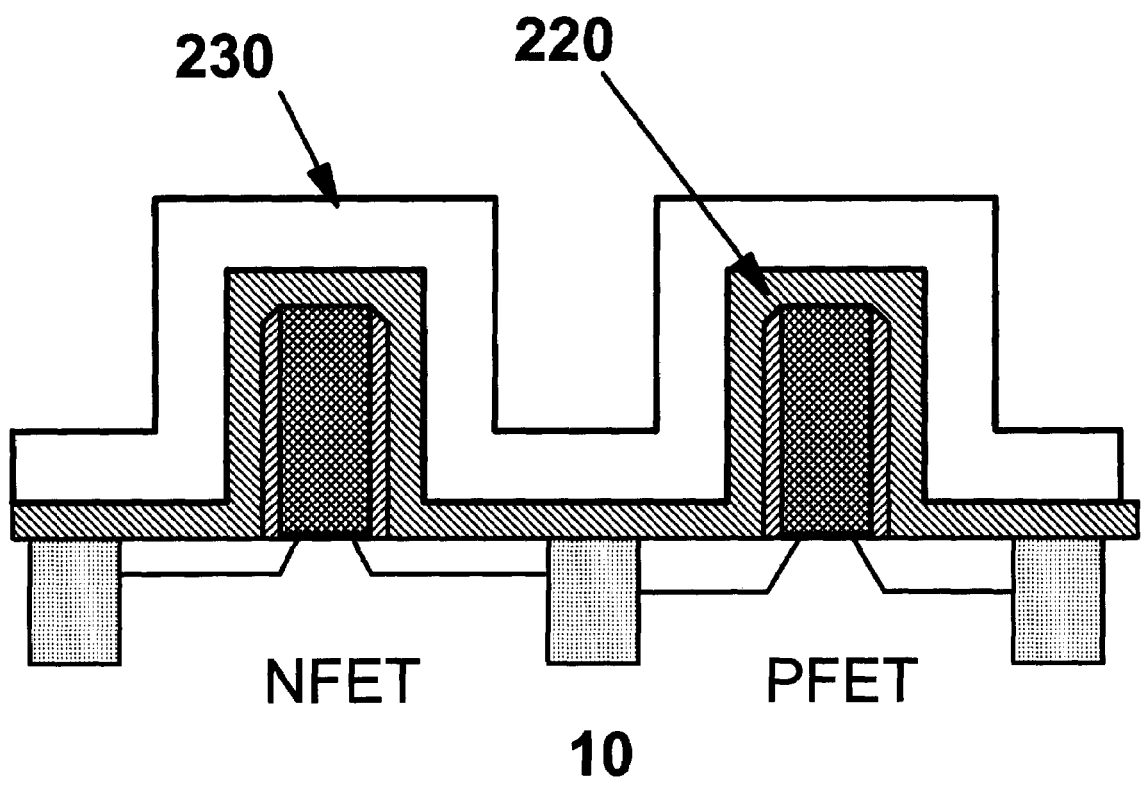
FIG. 6 shows the structure of FIG. 5, after a dielectric film having low stress 230 is deposited.

FIG. 3(a) and FIG. 3(b) show an example of a circuit and layout using this invention. FIG. 3(a) shows the circuit schematic of an inverter, while FIG. 3(b) shows a corresponding on-wafer layout. In the FIGS. 3(a) and 3(b), the pFET 150 is shown on the top of nFET 140. The compressive spacer width changes from wide in the pFET region to narrow in the nFET region. The transition region R is located approximately (±10%) in a middle region between the two devices 140, 150. The tensile etch stop layer 80 is shown over the entire device region or structure.

Figure 7:
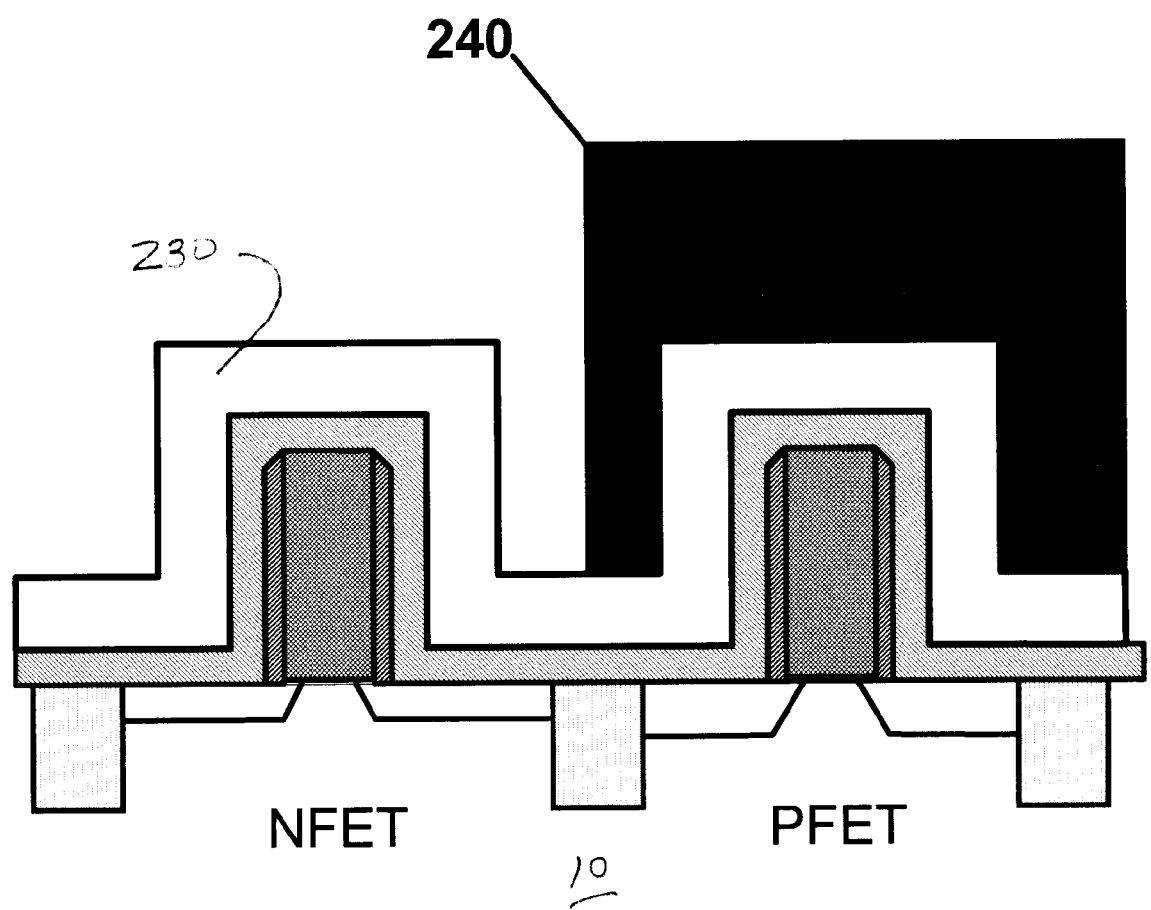
FIG. 7 shows the structure of FIG. 6, after a photoresist 240 is patterned.
Figure 8:
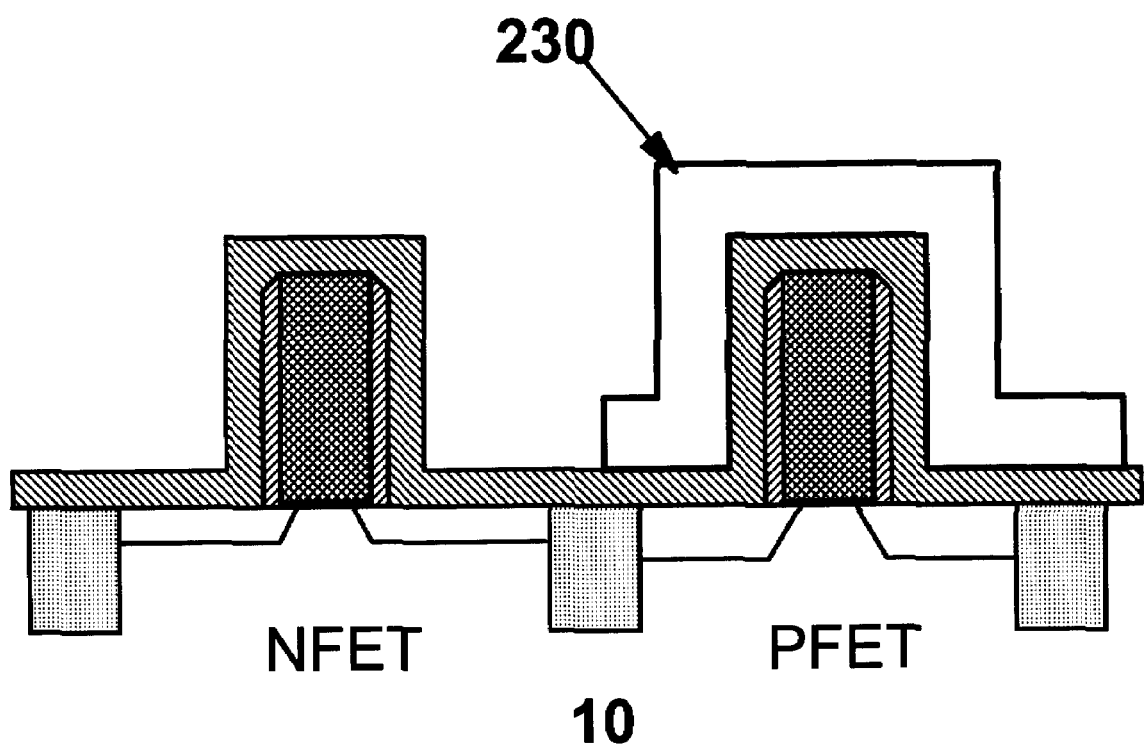
FIG. 8 shows the structure of FIG. 7, after an exposed part of the dielectric film having low stress 230 is removed, and the photoresist 240 is removed.
Figure 9:
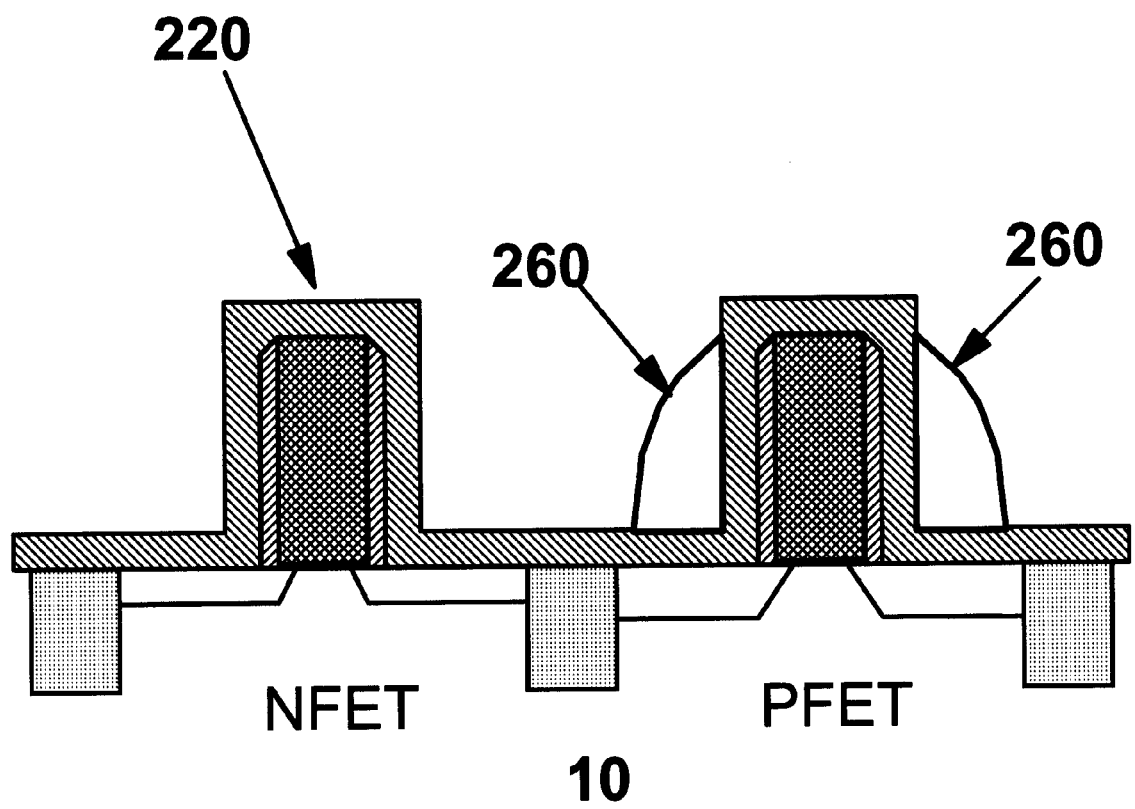
FIG. 9 shows the structure of FIG. 8, after a directional etch forms spacer(s) 260 comprising the dielectric film having low stress 230 only on the pFET side.

FIG. 4 to FIG. 14 show two alternative preferred process flows according to the present invention. Both flows start with FIG. 4 where isolations 190, gate stacks 200, extension implants 215 and (optional) extension spacers 210 are formed in any conventional manner. Spacer 210 has a typical substantially small width in a range of about 3 nm to about 20 nm. Then, a compressive dielectric film 220 (e.g., PECVD nitride) is deposited (see FIG. 5). Other materials for the film 220 are, for example, oxidized amorphous Si or poly-Si, $SiO_2$ or SiON. Film 220 has a substantially (±10%) uniform thickness in a range of about 20 nm to about 90 nm. Then, a second dielectric film with low stress 230 (e.g., CVD oxide) is also deposited (see FIG. 6). Other materials for the film 230 are, for example, SiON. Film 230 has a substantially uniform thickness in a range of about 3 nm to about 20 nm. In the first process flow, conventional lithography is applied (FIG. 7). A photoresist 240 covers the pFET side. Then part of the dielectric film with low stress 230 exposed is removed by conventional wet etch or dry etch (FIG. 8). Photoresist 240 is removed. This step leaves another part of the dielectric film with low stress 230 remaining only on the pFET side. Then, a directional etch is used to form a compressive spacer(s) 260 on only the pFET side (FIG. 9).

Figure 10:
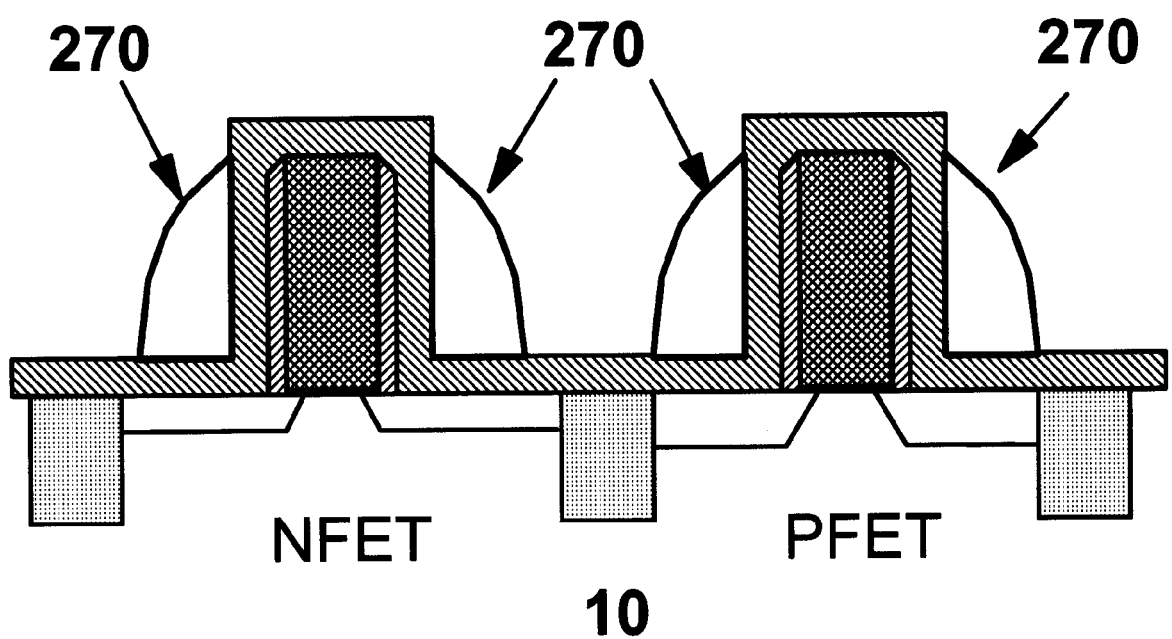
FIG. 10 shows the structure of FIG. 6, after a directional etch forms spacer(s) 270 comprising dielectric film having low stress 230 on both nFET and pFET.
Figure 11:
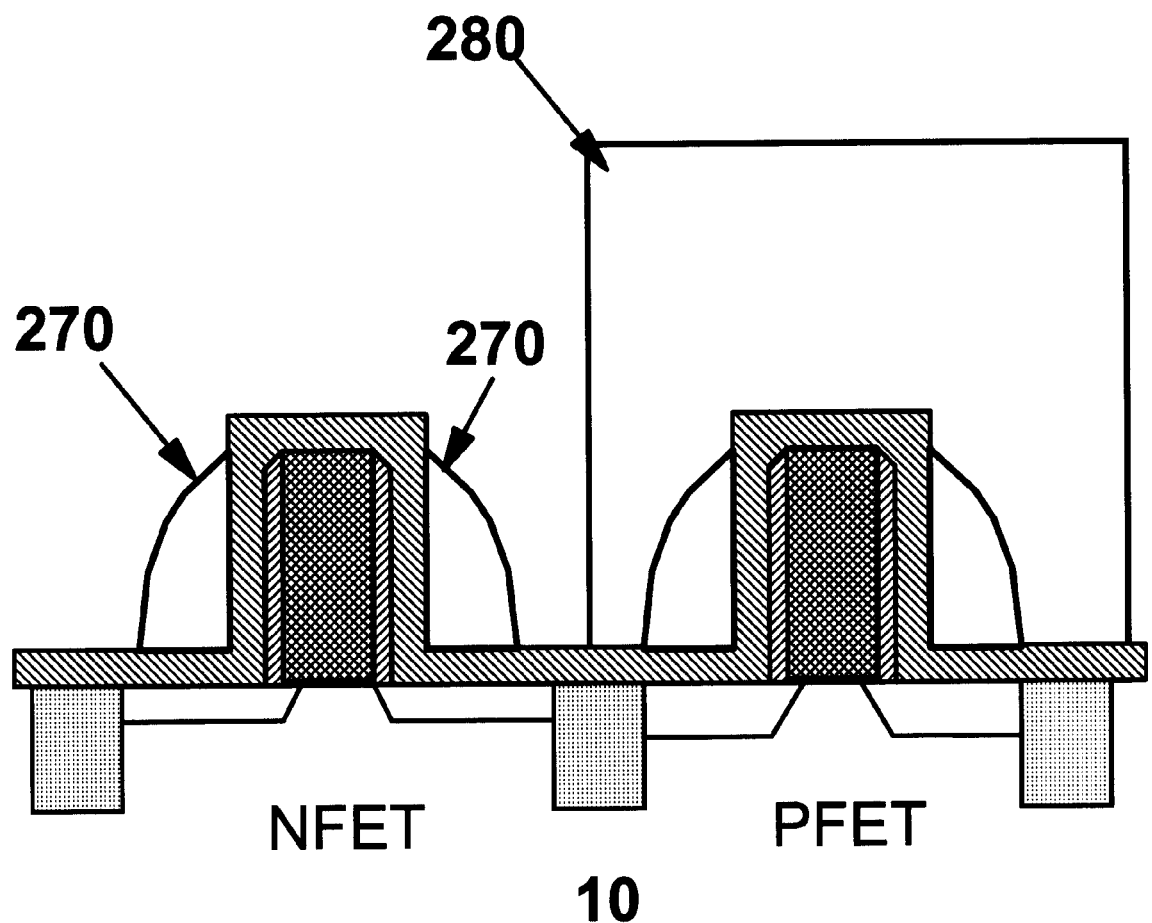
FIG. 11 shows the structure of FIG. 10, after a photoresist 280 is patterned.
Figure 12:
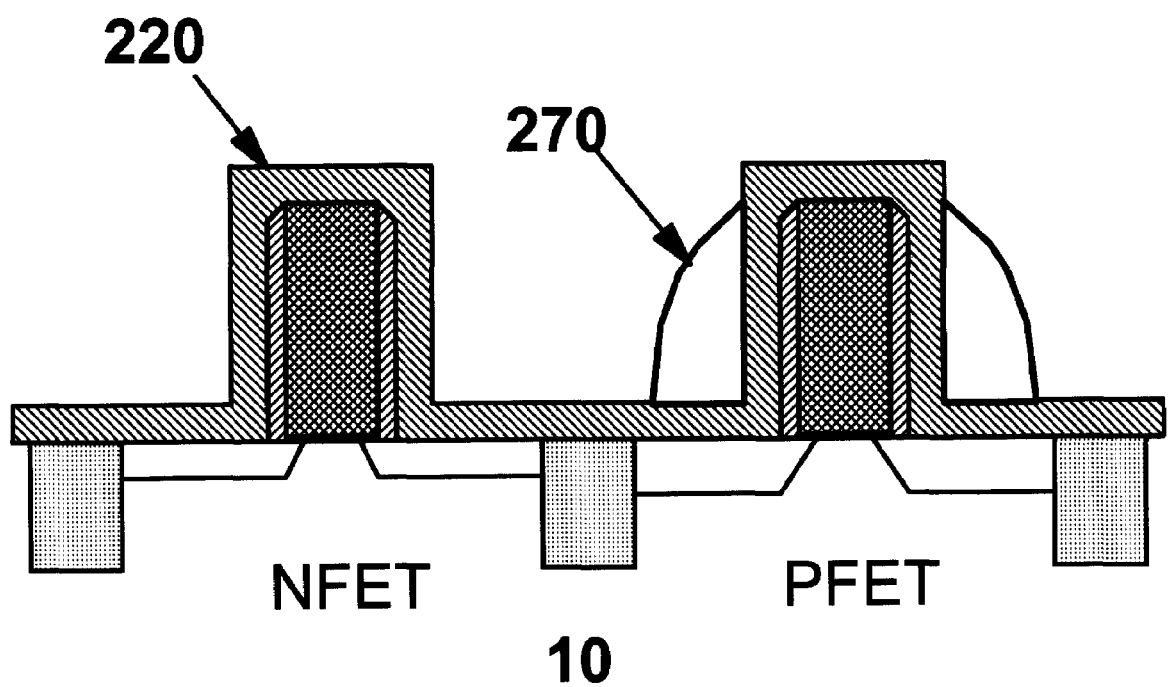
FIG. 12 shows the structure of FIG. 11, after an exposed part (nFET side) of dielectric with compressive stress 230 is removed, and the photoresist 280 is removed.
Figure 13:
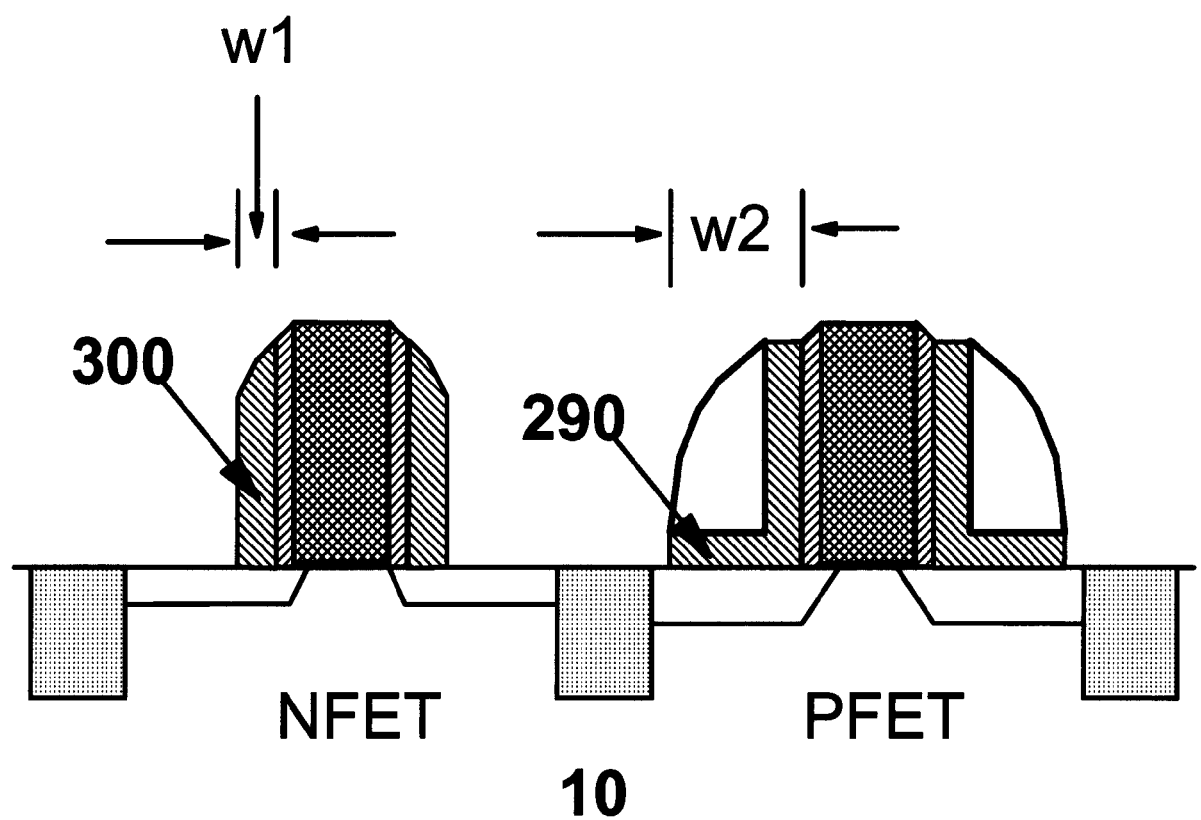
FIG. 13 shows the structure of FIG. 12 or FIG. 9, after a directional etch forms a narrow spacer 300 on the nFET side and a wide composite spacer 290 on the pFET side.

The same intermediate structure (FIG. 9) is achieved by an alternative process flow. Start from FIG. 6, wherein the second dielectric film with low stress 230 is deposited. Then, a directional etch is applied to form spacers 270 on both nFET and pFET with the dielectric film with low stress 230 (FIG. 10). Then, lithography is applied (FIG. 11). A photoresist 280 covers the pFET side and the spacers 270 on the nFET side are removed (FIG. 12). The photoresist 280 is removed, which results in spacers 270 only on the pFET side. The structure at this stage is, for example, identical to the one from previous flow (FIG. 9).

Another directional etch of the first compressive dielectric film 220 from either structure in FIG. 9 or FIG. 12 results in narrow compressive spacers 300 on the nFET side and wide composite compressive spacers 290 on the pFET side. The final structure (FIG. 14) is formed after n-type 310 and p-type 320 source/drain formations, silicide formations 330, with conventional techniques, and deposition (e.g., CVD or PECVD nitride) of the tensile barrier etch stop layer 340. The layer 340 is preferably disposed over the entire structure, and has a substantially uniform thickness in a range of about 25 nm to about 100 nm.

To recapitulate the alternative preferred process steps according to the present invention:

1) Provide starting wafer substrate (e.g., bulk, SOI, GaAs).

2) Perform conventional CMOS device processing: Device Isolation; Gate Stack Formation; Extension Implants.

3) Deposit compressive dielectric film 220 (e.g., PECVD nitride). Film thickness should be optimized to result in a highest possible nFET drive current. The nitride thickness determines the final silicide 330 to polysilicon gate spacing S1 (FIG. 15) and also determines the distance of the tensile barrier etch stop layer 340 to the nFET channel. The poly to silicide spacing S1 is critical to achieving high nFET drive current—saturated drive current output at drain. The level of compression in the film 220 is proportional to the drive current output for the pFET. The compressive stress in the film should be in the range of approximately (±10%) $-3E9$ $dynes/cm^2$ to approximately $-3E11$ $dynes/cm^2$. Deposited thickness of film 220 in a range of about 10 nm to about 40 nm is preferable. 4) Deposit second dielectric film with low stress 230 (e.g., CVD oxide). This film thickness is chosen to independently optimize pFET short channel effect control. The film 230 thickness determines the final silicide to poly gate spacing S2 (FIG. 15). The stress level along with the thickness of the film also defines a neutral buffer layer between the compressive spacer and the tensile etch stop layer. Thickness optimization of this film allows the compressive spacer for the pFET to have maximum influence on the pFET channel mobility and minimizes the influence of the tensile barrier etch stop layer 340. The stress level in the film 230 should be in the range of $-2E9$ $dynes/cm^2$ to $2E9$ $dynes/cm^2$. The film 230 thickness in a range of about 20 nm to about 200 nm can be chosen.

A spacer using the second dielectric film with low stress 230 covering only the pFET devices can now be formed using, e.g., two alternative methods.

Process Option #1

5a) Pattern photoresist 240 to cover pFET device(s) and expose nFET device(s). The second dielectric film with low stress 230 is now removed from nFET devices via a wet or dry etch. Photoresist 240 is removed by conventional methods. The second dielectric film with low stress 230 now covers only the pFET device(s).

5b) A directional etch is used to form a spacer from the second dielectric film with low stress 230. This spacer 260 is formed only on the pFET devices.

Process Option #2

5aa) A directional etch is used to form spacers 270 from the second dielectric film with low stress 230. These spacers with low stress are formed on both nFET and pFET devices.

5bb) Pattern photoresist to cover pFET devices and expose nFET devices (FIG. 11). The low stress spacer is removed from the nFET devices via wet or dry etch (FIG. 12). The spacer formed using the second dielectric film with low stress covers only the pFET devices.

6) A second conventional etch is used to form a narrow, compressive, I-shaped spacer 300 on the nFET device and a wider, compressive, L-shaped spacer 290 on the pFET device.

7) The final structure is formed after n-type and p-type source/drain formation, silicide formation and deposition of a tensile barrier etch stop layer 340. The stress level of the tensile barrier etch layer is proportional to the channel mobility of the nFET. The stress level of the tensile barrier etch stop layer 340 is preferably in a range of about 4E9 $dynes/cm^2$ to about 4E11 $dynes/cm^2$. Layer 340 preferably has a substantially (±10%) uniform thickness in the range of about 25 nm to about 100 nm.

Preferably: a maximum spacing for S1 is in a range of about 50 nm; a maximum spacing for S2 is in a range of about 100 nm; a maximum width for W1 is in a range of about 40 nm, a maximum width for W2 is in a range of about 90 nm.

While there has been shown and described what is at present considered a preferred embodiment of the present invention, it will be readily understood by those skilled in the art that various changes and modification may be made therein without departing from the spirit and scope of the present invention which shall be limited only by the scope of the claims.

What is claimed is:

1. A semiconductor device structure, comprising:
   at least first and second field effect transistors disposed on a substrate;
   said first field effect transistor including a first spacer having a first width;
   said second field effect transistor including a second spacer having a second width;
   wherein said first spacer and second spacer include a first compressive stress material, and said structure further comprises a tensile stress material disposed on said at least first and second field effect transistors.

2. The structure as claimed in claim 1, wherein said first field effect transistor is an nFET and said second field effect transistor is a pFET.

3. The structure as claimed in claim 1, wherein said first width is less than said second width.

4. The structure as claimed in claim 1, wherein said structure is an inverter.

5. The structure as claimed in claim 1, wherein said structure includes a width transition region located approximately in a middle region between said transistors.

6. The structure as claimed in claim 1, wherein said first spacer includes an I-shaped part and said second spacer includes an L-shaped part.

7. The structure as claimed in claim 1, wherein said second spacer includes an L-shaped part and said first compressive stress material.

8. The structure as claimed in claim 1, wherein said first width is a substantially uniform width in a range of about 10 nm to about 30 nm, and said second width has a maximum width in a range of about 50 nm to about 120 nm.

9. The structure as claimed in claim 1, wherein said first compressive stress material has a substantially uniform stress in a range of about $-3E9$ dynes/cm$^2$ to about $-3E11$ dynes/cm$^2$.

10. The structure claimed in claim 1, wherein said tensile stress material has a substantially uniform film thickness in a range of about 20 nm to about 100 nm and a substantially uniform stress in a range of approximately 4E9 dynes/cm$^2$ to approximately 4E11 dynes/cm$^2$.

11. The structure as claimed in claim 1, wherein said second spacer includes a second compressive stress material having a stress in a range of approximately $-2E9$ dynes/cm$^2$ to approximately 2E9 dynes/cm$^2$.

12. The structure as claimed in claim 1, wherein said first compressive stress material is a dielectric.

13. The structure as claimed in claim 1, wherein said first compressive stress material is silicon nitride.

14. The structure as claimed in claim 1, wherein said tensile stress material is SiN.

15. The structure as claimed in claim 1, wherein said first width is about 50 nm, and said second width has a maximum width of about 90 nm.

16. The structure as claimed in claim 1, wherein said tensile stress material is a layer having a substantially uniform thickness in a range of about 20 nm to about 100 nm.

17. The structure as claimed in claim 1, wherein said substrate is a silicon substrate.

18. The structure as claimed in claim 1, wherein said substrate comprises GaAs.

* * * * *